US006376877B1

(12) United States Patent
Yu et al.

(10) Patent No.: US 6,376,877 B1
(45) Date of Patent: Apr. 23, 2002

(54) DOUBLE SELF-ALIGNING SHALLOW TRENCH ISOLATION SEMICONDUCTOR AND MANUFACTURING METHOD THEREFOR

(75) Inventors: Allen S. Yu, Fremont; Jeffrey A. Shields, Sunnyvale, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/513,260

(22) Filed: Feb. 24, 2000

(51) Int. Cl.⁷ .............................. H01L 29/788
(52) U.S. Cl. .................. 257/317; 257/315; 257/321; 257/510
(58) Field of Search ................ 257/315, 317, 257/321, 510, 515; 438/260, 221, 296

(56) References Cited

U.S. PATENT DOCUMENTS

| | | | |
|---|---|---|---|
| 5,622,881 A | * 4/1997 | Acocella et al. | 438/264 |
| 5,698,879 A | * 12/1997 | Aritome et al. | 257/315 |
| 5,859,459 A | * 1/1999 | Ikeda | 257/374 |
| 5,889,304 A | * 3/1999 | Watanabe et al. | 257/321 |
| 5,946,230 A | * 8/1999 | Shimizu et al. | 365/185.01 |
| 6,130,129 A | * 10/2000 | Chen | 438/257 |
| 6,140,182 A | * 10/2000 | Chen | 438/259 |
| 6,159,801 A | * 12/2000 | Hsieh et al. | 438/259 |
| 6,222,225 B1 | * 4/2001 | Nakamura et al. | 257/315 |

OTHER PUBLICATIONS

Aritome et al., A 0.67 um2 Self–Aligned Shallow Trench Isolation Cell (SA–STI Cell) for 3V–only 256 Mbit NAND EEPROMs, 1994, IEEE, IEDM 94, pp. 61–64.*
Guillaumot et al., Flash EEPROM Cells Using Shallow Trench Isolation, 1996, IEEE Int'l NonVolatile memory Technology Conference, pp. 74–75.*

* cited by examiner

Primary Examiner—Eddie Lee
Assistant Examiner—George C. Eckert, II
(74) Attorney, Agent, or Firm—Mikio Ishimaru

(57) ABSTRACT

A reduced device geometry and increased device efficiency semiconductor memory device is provided. The method of manufacturing the semiconductor memory device includes forming shallow trench isolations (STIs) on the semiconductor substrate, forming a photoresist mask over the STIs, selectively etching the STIs to form curved surface area profiles, growing a layer of tunnel oxide (TOX) over exposed areas of the semiconductor substrate, forming a first polysilicon (poly) layer over the TOX layer and the STIs, chemical-mechanical polishing (CMP) the first poly layer, forming an oxide-nitride-oxide (ONO) layer over the first poly layer, and forming a second poly layer over the ONO layer.

9 Claims, 7 Drawing Sheets

DOUBLE SELF-ALIGNING SHALLOW TRENCH ISOLATION SEMICONDUCTOR AND MANUFACTURING METHOD THEREFOR

CROSS-REFERENCE TO RELATED APPLICATION(S)

The present application contains subject matter related to a concurrently filed U.S. patent application by Allen S. Yu, Thomas C. Scholer, and Paul J. teffan entitled "SEMICONDUCTOR WITH INCREASED GATE COUPLING COEFFICIENT AND MANUFACTURING METHOD THEREFOR". The related application is assigned to Advanced Micro Devices, Inc. and is identified by Ser. No. 09/513,261.

TECHNICAL FIELD

The present invention relates generally to semiconductors and more specifically to high gate constant, shallow trench isolation semiconductor memory devices.

BACKGROUND ART

Flash EEPROMs (electrically erasable programmable read only memories) are a class of nonvolatile semiconductor memory devices that are programmed by hot electron injection and erased by Fowler-Nordheim tunneling. Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric or tunnel oxide layer formed on the surface of substrate overlying the channel region; a polysilicon (poly) floating gate overlying the tunnel oxide; an interpoly dielectric overlying the floating gate; and a poly control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

A Flash EEPROM also includes peripheral portions, which typically include input/output circuitry for selectively addressing individual memory cells.

The process of forming Flash EEPROM cells is well known and widely practiced throughout the semiconductor industry. After the formation of the memory cells, electrical connections, commonly known as "contacts", must be made to connect the stack gated structure, the source region and the drain regions to other part of the chip.

The contact process starts with the formation of sidewall spacers around the stacked gate structures of each memory cell. An etch stop or liner layer, typically a nitride material such silicon nitride, is then formed over the entire substrate, including the stacked gate structure, using conventional techniques, such as chemical vapor deposition (CVD). A dielectric layer, generally of oxide such as boro-phospho-tetra-ethyl-ortho silicate (BPTEOS) or borophosphosilicate glass (BPSG), is then deposited over the etch stop layer. A layer of photoresist is then placed over the dielectric layer and is photolithographically processed to form a photoresist mask. An anisotropic etch is then used to etch out portions of the dielectric layer to form source and drain contact openings in the oxide layer. The contact openings stop at the source and drain regions in the substrate. The photoresist mask is then stripped, and a conductive material, such as tungsten, is deposited over the dielectric layer and fills the source and drain contact openings to form so-called "self-aligned contacts" (conductive contacts). The substrate is then subjected to a chemical-mechanical polishing (CMP) process, which removes the conductive material above the dielectric layer to form the conductive contacts through a contact CMP process.

For miniaturization, it is desirable to dispose the Flash EEPROM cells as closely together as possible. A commonly used process to achieve bit line isolation between the memory cells is local oxidation of silicon (LOCOS) isolation. This LOCOS process consumes silicon, which creates a surface area profile resembling a bird's beak. The reduction in silicon reduces density. The bird's beak surface area profile adds to the minimnum dimension between adjacent Flash EEPROM cells, and it is becoming more problematic as the distance between adjacent memory cells diminishes.

Another problem associated with the Flash EEPROM cells is maintaining the gate coupling coefficient ($C_G$). The $C_G$ is the ratio of the floating voltage with respect to the control voltage. A larger $C_G$ corresponds to greater device efficiency.

A solution, which would allow further miniaturization of semiconductor memory device without adversely affecting device performance has long been sought, but has eluded those skilled in the art. As the demand for higher performance devices and miniaturization continues at a rapid pace in the semiconductor field, it is becoming more pressing that a solution be found.

DISCLOSURE OF THE INVENTION

The present invention provides a method for reducing semiconductor device geometry by using shallow trench isolation for bit line isolation of floating gates.

The present invention provides a method for reducing semiconductor device geometry by eliminating the bird's beak phenomenon of local oxidation of silicon (LOCOS) isolation to enable semiconductor gate structures to be positioned closer together.

The present invention provides a method for forming a semiconductor device that provides increased gate coupling coefficient for greater device efficiency.

The present invention provides a method for forming a semiconductor device that increases the surface area of the insulator disposed between the control gate and the floating gate of an EEPROM device for greater device efficiency.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
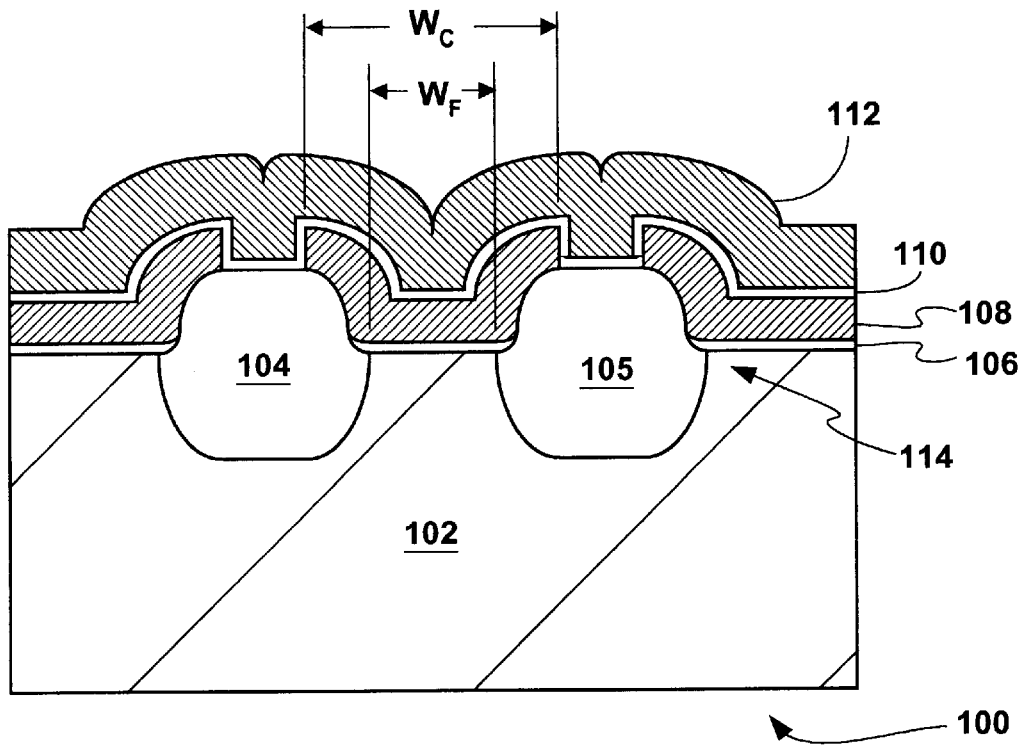
FIG. 1 (PRIOR ART) is a cross-section view of a conventional semiconductor memory device.

Referring now to FIG. 1 (PRIOR ART), therein is shown a cross section of a conventional semiconductor memory device 100, such as a Flash EEPROM (electrically erasable programmable read only memory), in an intermediate state of processing. The structure shown is the result of a "bit-line" isolation technique called the "local oxidation of silicon" (LOCOS) isolation for making a floating gate. At this stage of processing, the floating gate for the semiconductor memory device 100 is shown on a semiconductor substrate 102, generally of doped silicon, with field oxide (FOX) regions 104 and 105, a tunnel oxide (TOX) layer 106, a first polysilicon (poly) layer 108, an oxynitride (ONO) layer 110, and a second poly layer 112 sequentially deposited on the semiconductor substrate 102. The width of the floating gate is given by $W_F$ and the width of the control gate by $W_C$.

A floating gate operates at greatest efficiency when the gate coupling coefficient ($C_G$) is the largest. The $C_G$ is directly proportional to the ratio of the floating voltage with respect to the control voltage:

$$V = \frac{Q}{C}$$

the floating gate voltage, $V_F = \frac{Q}{C_{TOX}} = \frac{(Q)(T_{TOX})}{(A_{TOX})(K_{TOX})}$ since $C_{TOX} = \frac{A_{TOX}}{T_{TOX}}(K_{TOX})$ Since they are in series, the reciprocal of the total capacitance will equal the sum of the reciprocals of the device's coupled capacitors:

$$\frac{1}{C_{TOTAL}} = \frac{1}{C_{TOX}} + \frac{1}{C_{ONO}}$$

therefore control voltage, $V_C = \frac{Q}{C_{TOTAL}} = \frac{Q}{C_{TOX}} + \frac{Q}{C_{ONO}}$ and since $C_{TOX} = \frac{A_{ONO}}{T_{ONO}}(K_{ONO})$ $$V_C = \frac{(Q)(T_{TOX})}{(A_{TOX})(K_{TOX})} + \frac{(Q)(T_{ONO})}{(A_{ONO})(K_{ONO})}$$

By definition: $C_G = \frac{V_F}{V_C}$

So, $C_G = \dfrac{\dfrac{(Q)(T_{TOX})}{(A_{TOX})(K_{TOX})}}{Q\left(\dfrac{T_{TOX}}{(A_{TOX})(K_{TOX})} + \dfrac{T_{ONO}}{(A_{ONO})(K_{ONO})}\right)}$ For simplicity, assume $K_{TOX} \cong K_{ONO}$ Since the word line completely overlays the floating gates 108, the surface area that they couple is best described as W=the width of the ONO layer sandwiched between the two poly layers.

So the ratio of: $\dfrac{A_{TOX}}{A_{ONO}} = \dfrac{W_F}{W_C}$

Therefore, $C_G = \dfrac{1}{1 + \left(\dfrac{A_{TOX}}{A_{ONO}}\right)\left(\dfrac{T_{ONO}}{T_{TOX}}\right)} = \dfrac{W_C}{W_C + W_F\left(\dfrac{T_{ONO}}{T_{TOX}}\right)}$ So $C_G$ will increase as $\dfrac{W_F}{W_C}$ decreases.

$C_{TOX}$ = Tunnel oxide capacitance $C_{ONO}$ = ONO capacitance $A_{TOX}$ = Surface area of tunnel capacitor $A_{ONO}$ = Surface area of ONO capacitor $T_{TOX}$ = Tunnel oxide thickness $T_{ONO}$ = ONO thickness In its reduced form, $C_G$ is a function of the ratio of the width of the floating gate ($W_F$) and the width of the control gate ($W_C$). The larger $W_C$ is relative to $W_F$, the greater the device efficiency.

During LOCOS, as the semiconductor substrate 102 is consumed by the oxide, the FOX regions 104 and 105 grow under the TOX layer 106 causing bird's beaks 114. With dimensions shrinking for ever tighter geometry and greater memory cell density, the LOCOS process becomes inadequate because the bird's beaks 114 encroachment becomes proportionately too large.

Figure 2:
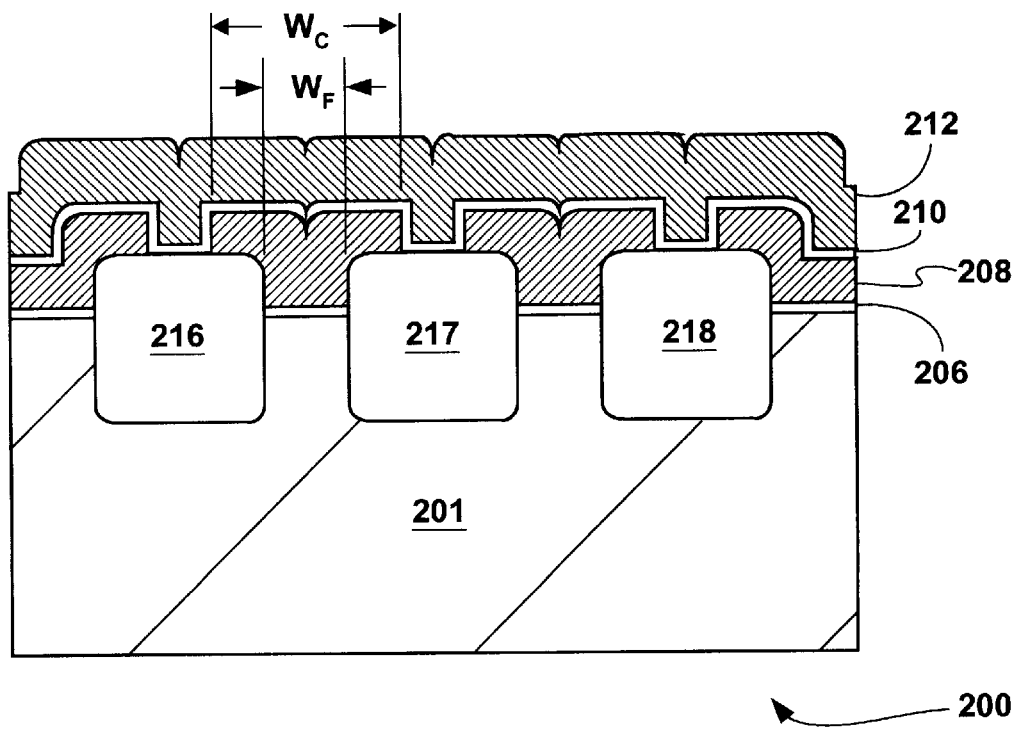
FIG. 2 (PRIOR ART) is a cross-section view of an alternative isolation scheme for a conventional semiconductor memory device.

Referring now to FIG. 2 (PRIOR ART), therein is shown a relatively new isolation structure in an intermediate state of processing for another conventional semiconductor memory device 200. The structure now coming into use is the result of a "bit-line" isolation technique called "shallow trench isolation"(STI). At this stage of processing, the floating gate for the Flash EEPROM is shown on a semiconductor substrate 201 with an oxide, shallow trench isolations (STIS) 216–218, a TOX layer 206, a first poly layer 208, an ONO layer 210, and a second poly layer 212 deposited on the semiconductor substrate 202. This process does not have the bird's beak surface area profile and thus allows for greater density over the LOCOS process. However, the tighter pitch among the STIs 216–218 and the more vertical surface area profile of the first poly layer 208 lessens the surface area of the ONO 25 layer 210. The ONO surface area is directly proportional to $C_G$ and is a contributing factor in determining the $C_G$. The lower the ONO surface area the lower the $C_G$. Accordingly, the present STI approach permits greater density of the semiconductor memory devices but lessens the efficiency of each semiconductor memory device.

Referring now to FIGS. 3 through 6, therein are shown the sequence of process steps for forming a floating gate for an EEPROM device formed on a semiconductor substrate in accordance with the present invention.

Figure 3:
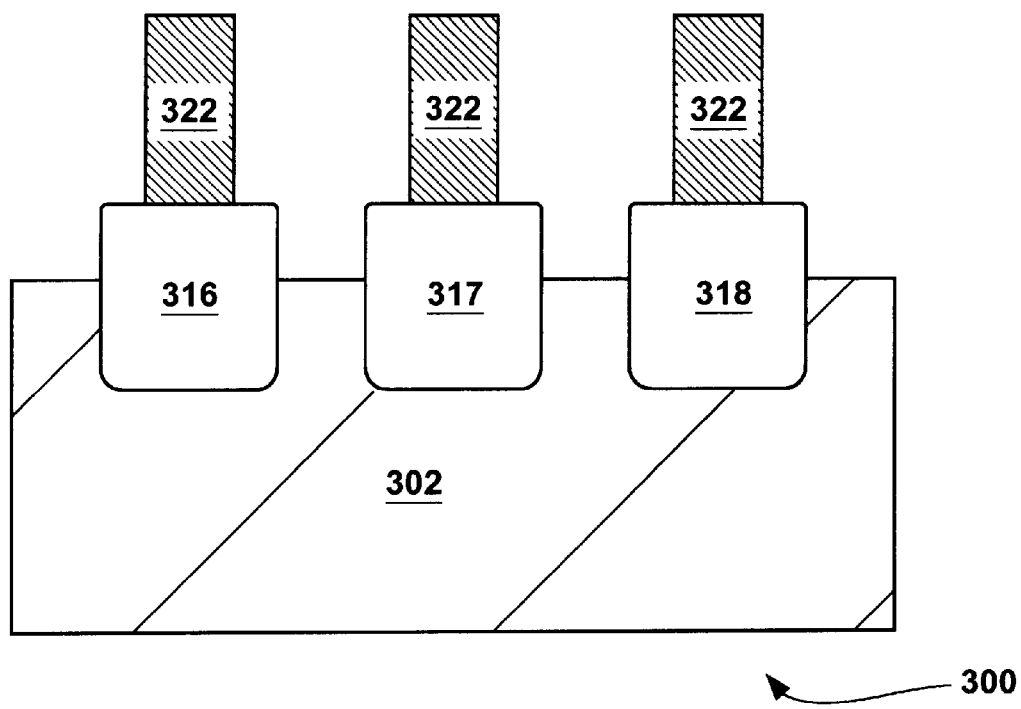
FIG. 3 is a cross-section view of a semiconductor device in an intermediate state of processing according to the present invention.

Referring now to FIG. 3, therein is shown a cross section of a semiconductor memory device 300 in an intermediate state of processing. At this stage are shown a semiconductor substrate 302, embedded STIs 316–318, and a photoresist mask 322 centered on top of each of the STIs 316–318. The STIs 316–318 are formed conventionally using processing techniques well known in the art of semiconductor processing. A film (not shown), preferably silicon nitride, is used to define the height of the STIs 316–318 that is exposed above the semiconductor substrate 302. The photoresist mask 322 is placed above each of the STIs 316–318. For simplicity of illustration, only three of the STIs 316–318 are shown.

Figure 4A:
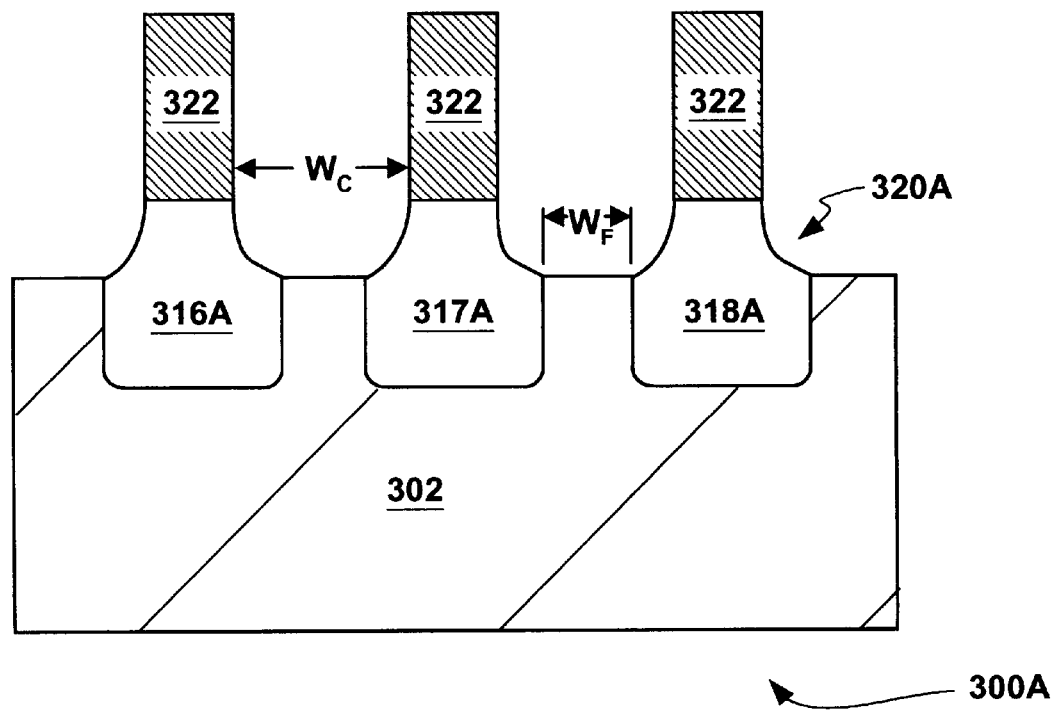
FIGS. 4A, 4B, and 4C are cross-section views after a step of etching the exposed shallow trench isolation (STI) with respective anisotropic, isotropic and combination etches to produce characteristic surface area profiles.

Referring now to FIG. 4A, therein is shown the semiconductor memory device 300 after the step of etching the exposed STIs 316–318 with an anisotropic etch to create the STIs 316A–318A having the single curved surface area profiles 320A.

Figure 4B:
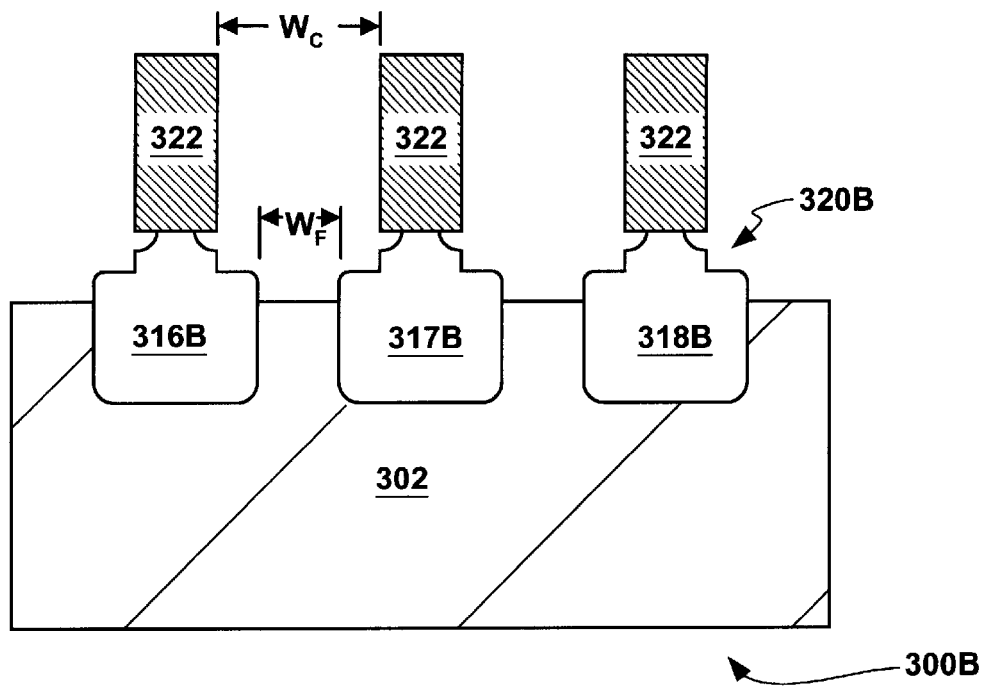

Referring now to FIG. 4B, therein is shown the semiconductor memory device 300 after the step of etching the exposed STIs 316–318 with an anisotropic etch to create the STIs 316B–318B having the T-shaped surface area profiles 320B.

Figure 4C:
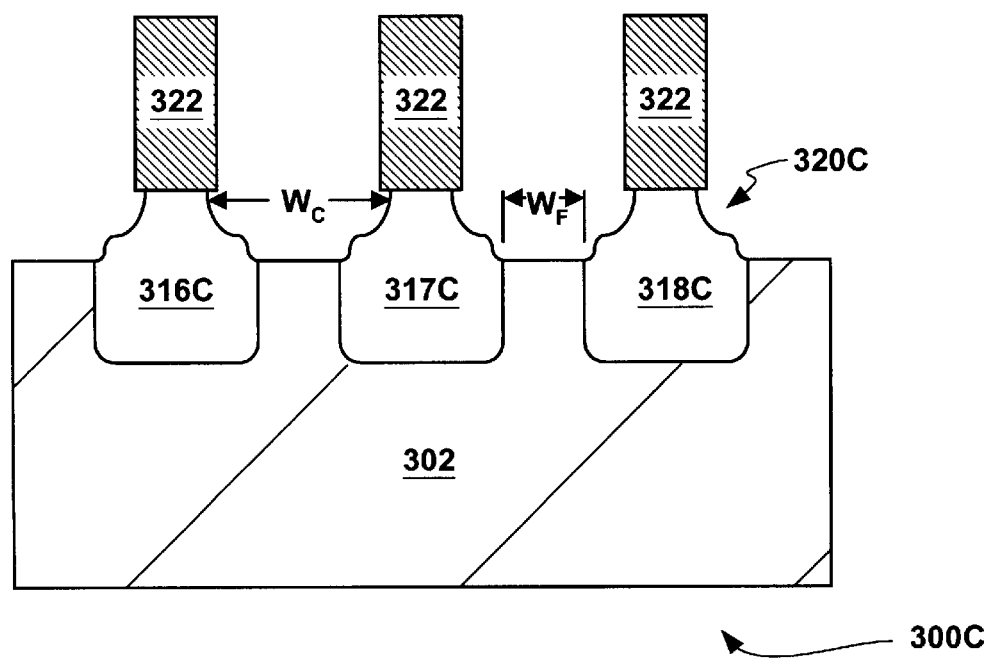

Referring now to FIG. 4C, therein is shown the semiconductor memory device 300 after the step of etching the exposed STIs 316–318 with an initial isotropic etch to about the midpoint of the exposed STIs 316–318 followed by an anisotropic etch to create the STIs 316C–318C having the multi-curved surface area profiles 320C.

As seen from FIGS. 4A–4C, the different etch processes provide different surface area profiles 320A–320C and different combinations of $W_F$ and $W_C$.

Figure 5A:
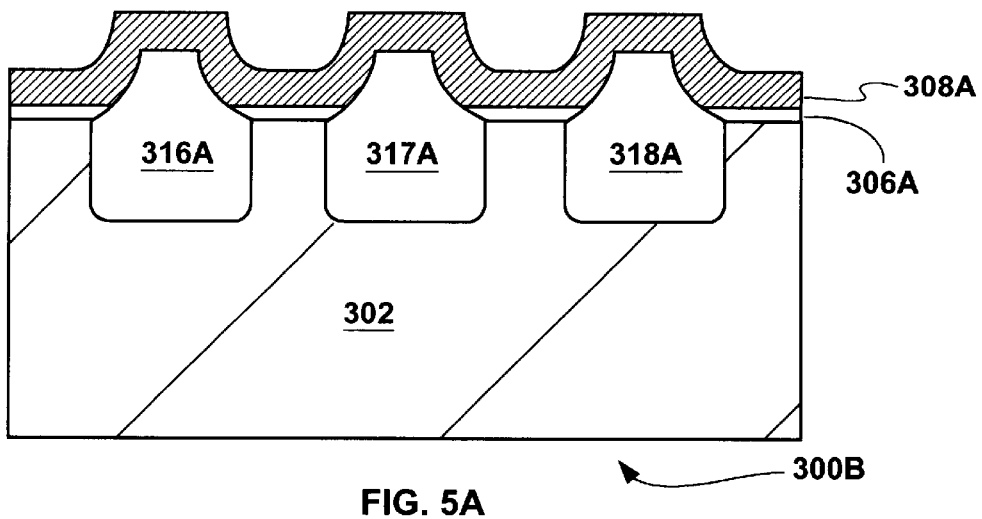
FIGS. 5A, 5B, and 5C are cross-section views after a step of removing the photoresist mask, growing a tunnel oxide (TOX) layer, and depositing a first poly (poly) layer over the entire surface.
Figure 5B:
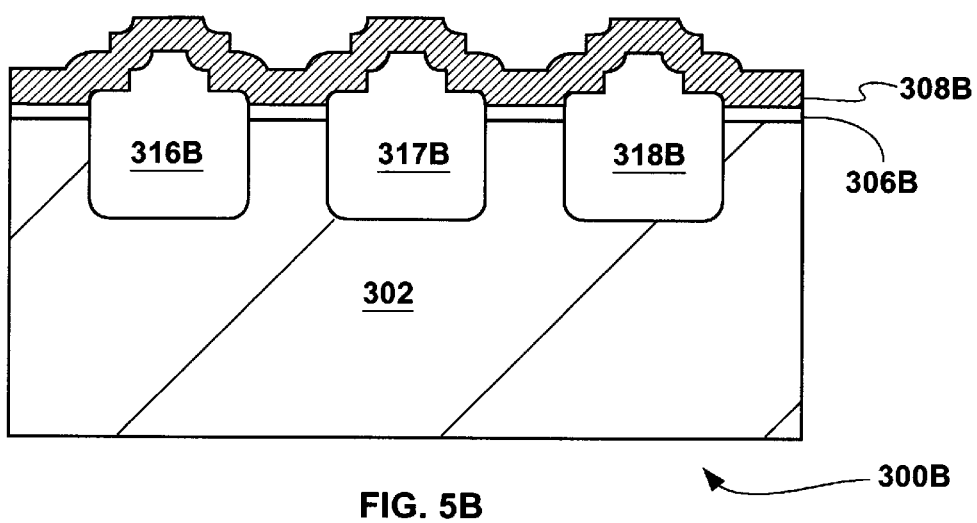
Figure 5C:
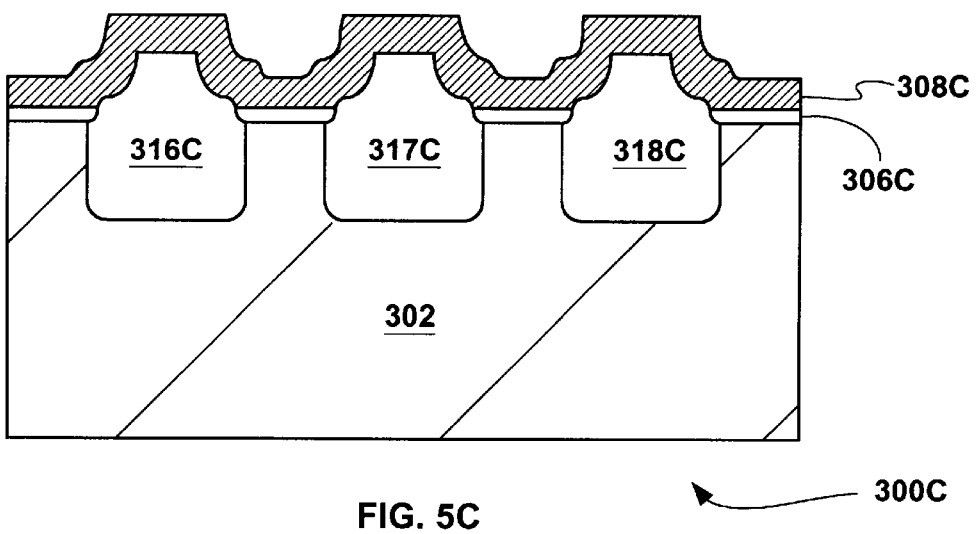

Referring now to FIGS. 5A, 5B, and 5C, therein are shown the respective FIGS. 4A, 4B, and 4C semiconductor memory devices 300A–300C after the steps of removing the photoresist mask 322, growing TOX layers 306A–306C, respectively, and depositing a first poly layer 308A–308C, respectively. It will be noted that the TOX layers 306A–306C are conformal and have surface area profiles that match the surface area profiles of the STI surface area profiles 320A–320C.

The TOX layers 306A–C are thin and use the silicon in the semiconductor substrate 302 as a silicon source for formation. Thus, the TOX layers 306A–C are not formed on top of the STIs 316A–316C through 318A–318C since they contain no silicon.

Specifically, FIG. 5A shows a semiconductor memory device 300A after the step of removing the photoresist mask 322, growing the TOX layer 306A, and depositing a first poly layer 308A over the entire surface. FIG. 5B shows a semiconductor memory device 300B after the step of removing the photoresist mask 322, growing the TOX layer 306B and depositing a first poly layer 308B over the entire surface. FIG. 5C shows a semiconductor memory device 300C after the step of removing the photoresist mask 322, growing the TOX layer 306C, and depositing a first poly layer 308C over the entire surface.

Figure 6A:
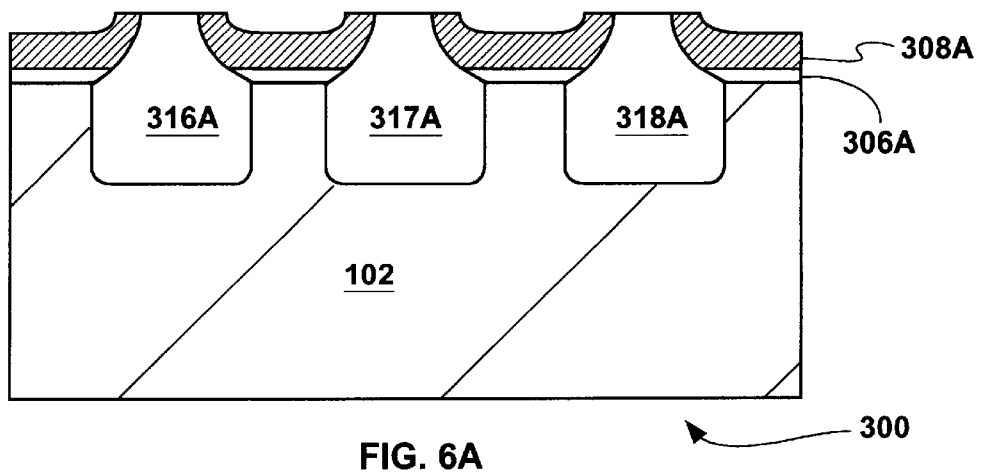
FIGS. 6A, 6B, and 6C are cross-section views of the present invention which are equivalent to FIG. 2.
Figure 6B:
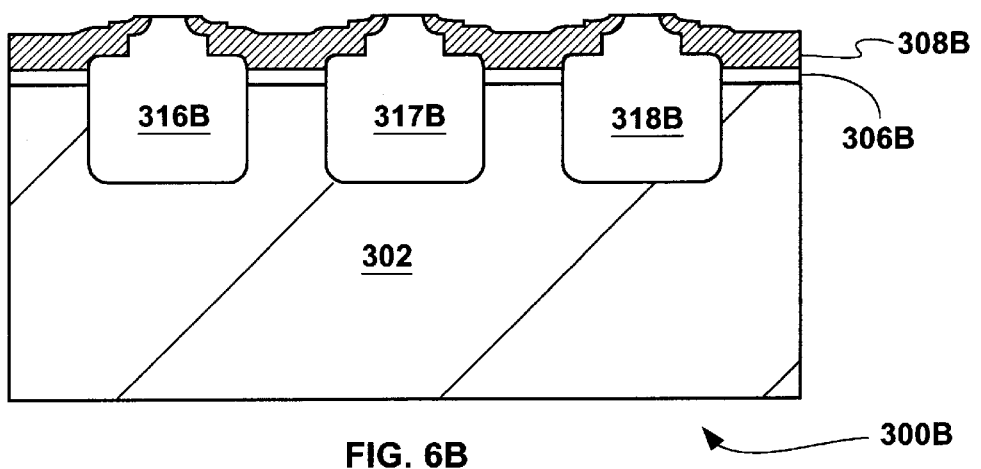
Figure 6C:
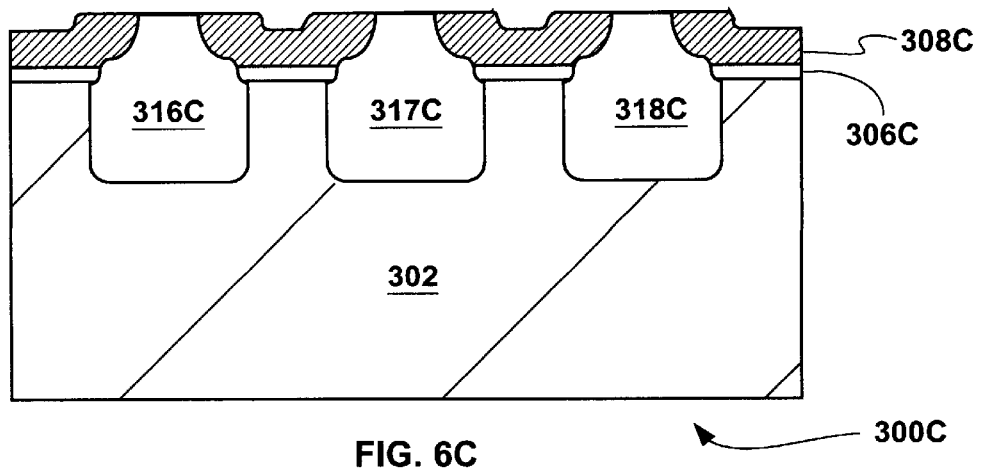

Referring now to FIGS. 6A, 6B, and 6C, therein are shown the semiconductor memory devices 300A–300C after the step of chemical-mechanical polishing (CMP) of the first poly layers 308A–308C, respectively, stopping at the top surfaces of the STIs 316A–318A through 316C–318C, respectively. For FIG. 6A, the surface area profile of the first poly layer 308A among the STIs 316A–316C appears as large curves. For FIG. 6B, the surface area profile of the first poly layer 308B among the STIs 317A–317C appears as multiple slight curves. For FIG. 6C, the surface area profile of the first poly layer 308C among the STIs 316A–316C appears as slight curves. It would be understood that the first poly layers 308A–308C would appear flat if the layers were sufficiently thick.

Figure 7A:
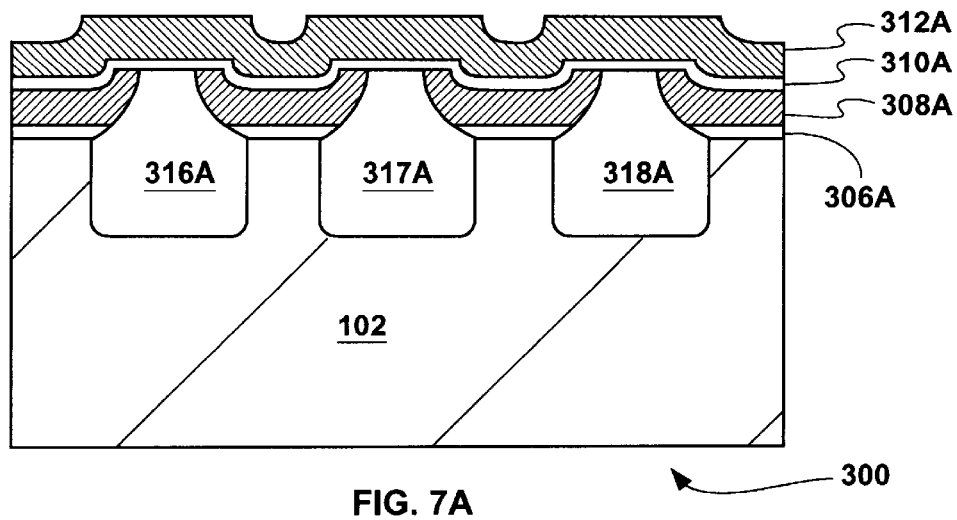
FIGS. 7A, 7B, and 7C are cross-section views after a step of chemical-mechanical polishing (CMP) of the entire surface stopping at the top surface of the STIs.
Figure 7B:
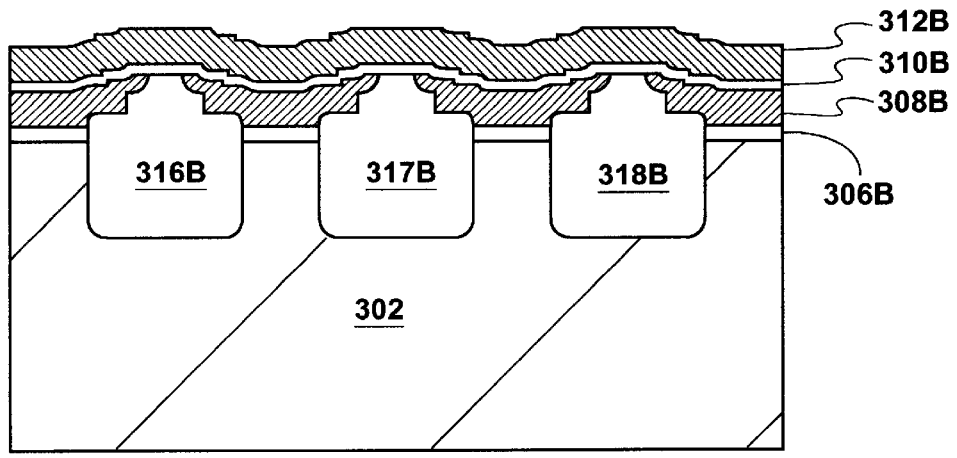
Figure 7C:
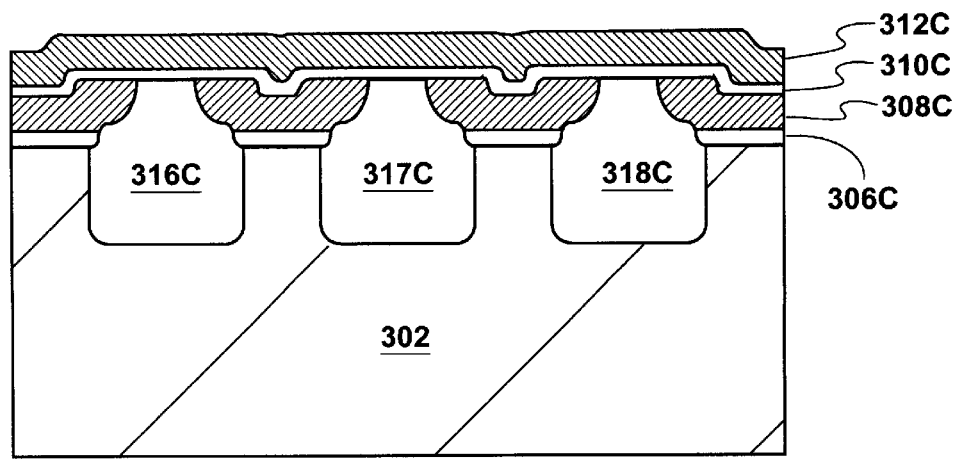

Referring now to FIGS. 7A, 7B, and 7C, therein are shown the semiconductor memory devices 300A–300C after the steps of forming ONO layers 310A–310C on top of the first poly layers 308A–308C, respectively, and depositing second poly layers 312A–312C on top of the ONO layers 310A–310C, respectively. The etching of the STIs provides increased surface area profiles for the ONO layers 310A–310C which improves the device efficiencies of the semiconductor devices 300A–300C.

For FIG. 7A, the surface area profile of the STIs 316A–318A appears as large concave curves. For FIG. 7B, the surface area profile of the STIs 316B–318B appears as multiple small curves including small concave curves. For FIG. 7C, the surface area profile of the STIs 316C–318C appears as multiple small and large concave curves. In each embodiment, the top concave curve is adjacent the ONO layers 310 A-C. It would be understood that the second poly layers 312A–312C are flattened out by the underlying STI's and the first poly layers 320A–C and would appear flat if the layers were sufficiently thick.

The ratio of $W_C$ and $W_F$ is large and the surface area for the ONO layers 310A–310C is also increased level by the varying pitch of the first poly layers 308A–308C. Accordingly, a gate structure for EEPROMS having STIs to achieve bit line isolation and high device efficiency is provided. The STIs afford production of EEPROM cells with greater density for tighter geometry and greater memory cell density.

Figure 8:
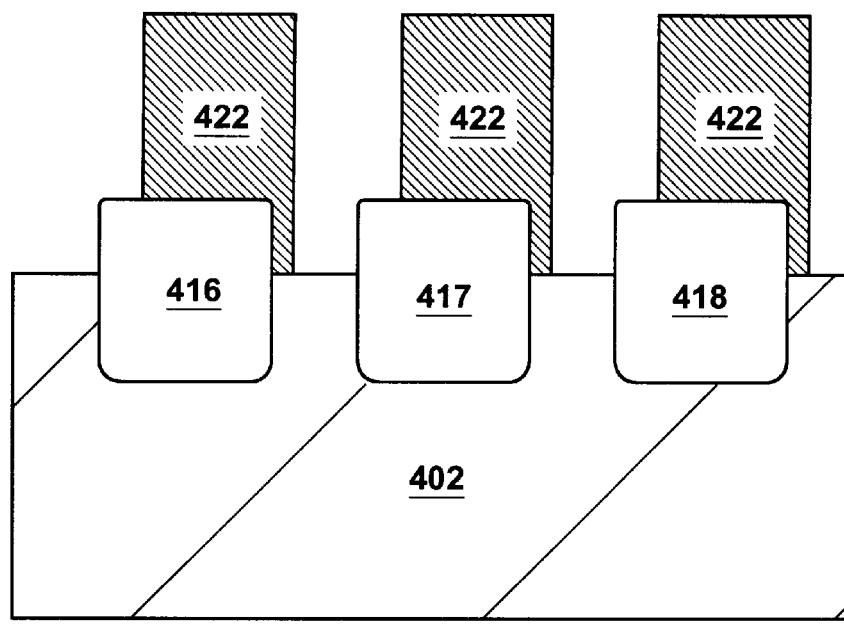
FIG. 8 illustrates an alternative embodiment manufactured using a conventional photoresist mask.

Referring now to FIG. 8, therein is shown a cross section of a semiconductor memory device 400 in an intermediate state of processing where STIs 416–418 have had a conventional photoresist mask 422 deposited and developed.

In the normal course of events, smaller semiconductor geometry requires the use of a more expensive, lithographic illuminating radiation source to print a minimum feature size image in the photoresist mask 422. The present invention eliminates the need for this more expensive equipment by using an additional step of trimming the photoresist mask 422.

Figure 9:
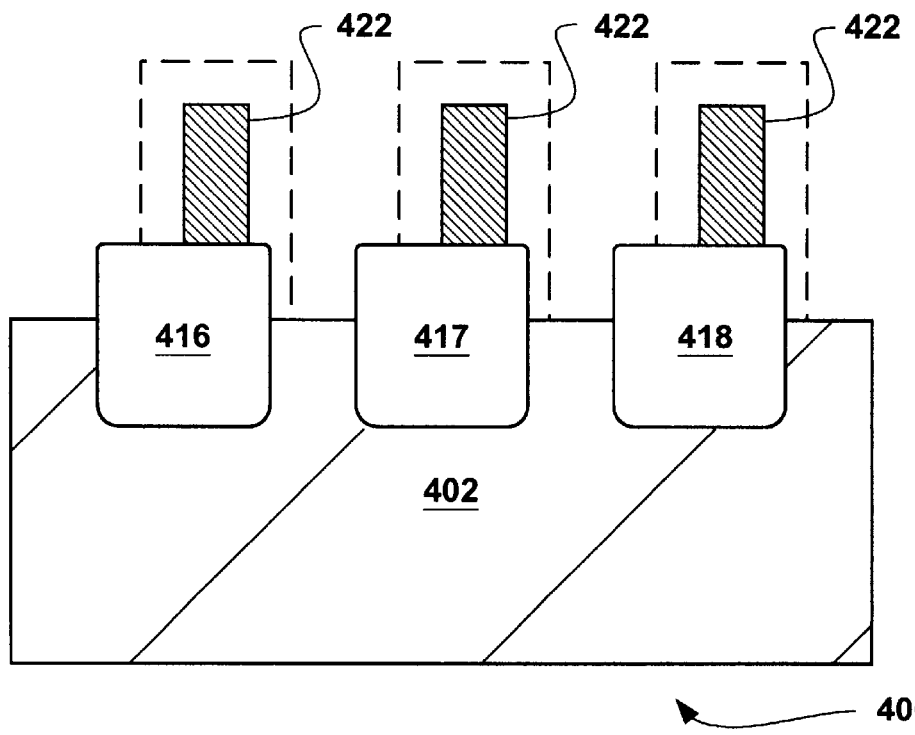
FIG. 9 illustrates the semiconductor device after the step of trimming the conventional photoresist mask according to the alternative embodiment.

Referring now to FIG. 9, therein is shown the semiconductor memory device 400 after a step of trimming the photoresist mask 422 on top of the STIs 416–418. Dotted lines show the outline of the original photoresist mask 422. A short, well-controlled plasma stripping process employing oxygen chemistry is used to trim the photoresist mask.

The trimming of the photoresist mask 422 is followed by one of the etching steps of FIGS. 4A–4C to obtain the desired surface area profile but with smaller semiconductor geometry. Accordingly, using this additional step provides similar results as those achieved with more precise and more expensive lithographic illuminating radiation sources.

In summary, FIGS. 3 through 6C illustrate an embodiment of the present invention for fabricating a semiconductor floating gate for an EEPROM with STIs for isolation of the bit lines. A photoresist is deposited, patterned using conventional lithographic illuminating radiation sources, and developed. The photoresist acts as a mask during the anisotropic, isotropic, or combination anisotropic/isotropic etch to achieve increased surface area profiles of the STIs. The increased surface area profiles for the subsequently formed ONO layer increase the $C_G$ for the devices. Accordingly, the present invention provides gate structures having STIs that afford higher $C_G$.

Alternatively and/or in addition, the photoresist mask is trimmed in-situ with the short, well-controlled, plasma oxide etch employing an oxygen containing chemistry in combination with some polymer forming gas species prior to the STI etch. This reduces the size of the resist and allows closer spacing and more precisely defined STI surface area profiles which result in more dense geometry.

The present invention involves a double self-alignment process. In the first self-alignment, the step of chemical-mechanical polishing (CMP) of the first poly layers 308A–308C, respectively, and stopping at the top surfaces of the STIs 316A–318A through 316C–318C, respectively, aligns the floating gates.

In the second self-alignment, the large overlay tolerance for the STI resist is compensated. Since there is a high likelihood that the resist, which forms the STI, will cover part of the active silicon, the resist trimming process reduces the size of the resist in all directions so that it will self-align or cover only the STI and not the active silicon region. This is exemplified by the placement of the resist mask 322 or 422. The resist mask 322 needs perfect alignment within the STIs 316C, 317C, and 318C, and is a critical mask since it requires an expensive radiation source or complex (phase shift) mask to print. The present invention allows a standard I-line radiation source to be used and the resist mask trimmed to fit inside the STIs 316–318.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations, which fall within the spirit and scope of the included claims. All matters set forth herein or shown in the accompanying drawings are to be interpreted in an illustrative and non-limiting sense.

The invention claimed is:

1. A semiconductor device comprising:

a semiconductor substrate;

insulator shallow trench isolations (STIs) having selected surface area profiles and disposed in the semiconductor substrate, the selected surface area profiles including multiple first and second concave curves, the multiple first concave curves having greater radii than the radii of the multiple second concave curves;

a tunnel oxide (TOX) layer disposed on the semiconductor substrate between the shallow trench isolations;

a first polysilicon (poly) layer disposed over the TOX layer and between the insulator shallow trench isolations to form a floating gate;

an oxynitride (ONO) layer disposed over the first poly layer and the shallow trench isolations, the shallow trench isolation having the multiple first concave curves adjacent the ONO layer; and a second poly layer disposed over the ONO layer to form a control gate.

2. The semiconductor device as claimed in claim 1 wherein the selected surface area profiles include the multiple first concave curves above the multiple second concave curves.

3. The semiconductor device as claimed in claim 1 wherein the selected surface area profiles include multiple convex curves.

4. The semiconductor device as claimed in claim 1 wherein the selected surface area profiles include multiple convex curves having the same radii as the multiple second concave curves.

5. The semiconductor device as claimed in claim 1 wherein the selected surface area profiles include the multiple first and second concave curves joined by multiple convex curves.

6. The semiconductor device as claimed in claim 1 wherein the STIs have top surfaces and the ONO layer extends below the top surfaces of the STIs.

7. The semiconductor device as claimed in claim 1 wherein the STIs have top surfaces and the ONO layer has a curve extending below the top surfaces of the STIs.

8. The semiconductor device as claimed in claim 1 wherein the STIs have top surfaces and the ONO layer has a upward concave curve extending below the top surfaces of the STIs.

9. The semiconductor device as claimed in claim 1 wherein the STIs have flat top surfaces and the ONO layer has a flat portion on and extending beyond the top surfaces of the STIs.

* * * * *

UNITED STATES PATENT AND TRADEMARK OFFICE
CERTIFICATE OF CORRECTION

PATENT NO.   : 6,376,877 B1  
DATED        : April 23, 2002  
INVENTOR(S)  : Yu et al.

It is certified that error appears in the above-identified patent and that said Letters Patent is hereby corrected as shown below:

Column 5,
Line 16, delete "filn" and insert therefor -- film --

Signed and Sealed this

Second Day of July, 2002

*Attest:*

*Attesting Officer*

JAMES E. ROGAN
*Director of the United States Patent and Trademark Office*